United States Patent
Hautson

(10) Patent No.: US 10,436,567 B2
(45) Date of Patent: Oct. 8, 2019

(54) METHOD FOR LOCATING MOBILE MAGNETIC OBJECTS PRESENTED BEFORE A NETWORK OF MAGNETOMETERS

(71) Applicant: Commissariat à l'énergie atomique et aux énergies alternatives, Paris (FR)

(72) Inventor: Tristan Hautson, Fontaine (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 1271 days.

(21) Appl. No.: 14/571,726

(22) Filed: Dec. 16, 2014

(65) Prior Publication Data
US 2015/0168123 A1 Jun. 18, 2015

(30) Foreign Application Priority Data
Dec. 16, 2013 (FR) ...................... 13 62730

(51) Int. Cl.
| | |
|---|---|
| G01B 7/02 | (2006.01) |
| G01R 33/00 | (2006.01) |
| G01V 3/08 | (2006.01) |
| G06F 3/0338 | (2013.01) |
| G06F 3/0362 | (2013.01) |

(52) U.S. Cl.
CPC ........... *G01B 7/02* (2013.01); *G01R 33/0094* (2013.01); *G01V 3/081* (2013.01); *G06F 3/0338* (2013.01); *G06F 3/0362* (2013.01)

(58) Field of Classification Search
CPC ...... G01B 7/02; G01R 33/0094; G01V 3/081; G06F 3/0362
USPC ....................................................... 702/150
See application file for complete search history.

(56) References Cited

U.S. PATENT DOCUMENTS

| | | | | |
|---|---|---|---|---|
| 6,263,230 | B1 * | 7/2001 | Haynor | A61B 5/062 128/899 |
| 6,269,324 | B1 | 7/2001 | Rakijas et al. | |
| 7,932,718 | B1 | 4/2011 | Wiegert | |
| 2002/0171427 | A1 * | 11/2002 | Wiegert | B63G 7/06 324/345 |
| 2003/0095115 | A1 | 5/2003 | Brian et al. | |

FOREIGN PATENT DOCUMENTS

| | | |
|---|---|---|
| FR | 2952450 | 5/2011 |
| FR | 2988862 | 10/2013 |
| FR | 2988874 | 10/2013 |
| GB | 2310930 | 9/1997 |

* cited by examiner

*Primary Examiner* — John E Breene
*Assistant Examiner* — Dacthang P Ngo
(74) *Attorney, Agent, or Firm* — Occhiuti & Rohlicek LLP

(57) ABSTRACT

A method for locating mobile objects by identifying, on the basis of the objects before a network of magnetometers, a supplementary equation. The method includes connecting, by means of a relationship of equality, a first variable from a current system of equations to a term, the term being a predefined relationship between one or more other variables from the current system of equations or a constant numerical value. The method also includes replacing, in the current system of equations, the first variable with the term to which it is equal to obtain a new system of equations in which the number of variables for which the value needs to be estimated is smaller than in the current system of equations. The method further includes using the new system of equations instead in order to estimate the position/orientation/amplitude of a magnetic moment of one of the magnetic objects.

9 Claims, 3 Drawing Sheets

METHOD FOR LOCATING MOBILE MAGNETIC OBJECTS PRESENTED BEFORE A NETWORK OF MAGNETOMETERS

RELATED APPLICATIONS

Under 35 USC 119, this application claims the benefit of the Dec. 16, 2013 priority date of French application number 1362730, the content of which is herein incorporated by reference in its entirety.

FIELD OF INVENTION

The invention concerns a method and a device for locating mobile magnetic objects presented before a network of magnetometers. The invention likewise relates to an information recording medium for implementing said method.

BACKGROUND

The patent applications FR2 988 862 and FR2 988 874 disclose methods for locating mobile magnetic objects presented before a network of magnetometers having N triaxial magnetometers mechanically connected to one another without any degree of freedom in order to preserve a known distance between each of said magnetometers, where N is an integer greater than or equal to five. Said known methods involve:
a) the measurement, by each of the magnetometers, of the amplitude of the magnetic field along each of the measurement axes thereof,
b) the estimation, on the basis of the measurements from the magnetometers, of the values of a plurality of variables by resolving a current system of equations connecting said variables to each measurement from a triaxial magnetometer of the network, each variable corresponding to the position or to the orientation or to the amplitude of a magnetic moment of a permanent magnet of the magnetic object,
the iteration of steps a) and b) at successive instants in time in order to obtain the estimated values of each variable at said various successive instants.

These methods work particularly well. In particular, said methods are capable of locating numerous different mobile magnetic objects. Moreover, they are also capable of simultaneously locating a plurality of mobile magnetic objects that are mechanically independent from one another. Owing to these capabilities, these methods are referred to as "flexible".

However, when the number of mobile magnetic objects to be located simultaneously increases, the precision of the locating of each of said mobile magnetic objects decreases.

Prior art is likewise known from: U.S. Pat. No. 7,932, 718B1, US2003/095115A1, FR2952450A1, US2002/171427A1, FR2988862A1, GB2310930A.

The aim of the invention is to improve the precision of said known methods for locating mobile magnetic objects, notably when the number of mobile magnetic objects to be located simultaneously increases, while preserving the flexibility of said methods.

SUMMARY

The invention therefore relates to such a method according to Claim 1.

The applicant has observed that reducing the number of variables in the system of equations used in step b) allows a reduction in the estimation noise of the estimated positions and orientations of the mobile magnetic objects. This therefore translates into an improvement in the precision of location of the mobile magnetic objects. However, it also reduces the flexibility of the method.

To reduce said number of variables without compromising the flexibility of the method, the above method starts by using a system of equations having numerous independent variables. Next, as a function of the mobile objects presented before the network of magnetometers, it identifies supplementary equations connecting together certain variables from the current system of equations or connecting a variable from a current system of equations to a constant value. Said supplementary equations are then used to reduce the number of variables for the current system of equations. Thus, said method automatically and dynamically adapts the number of variables for the system of equations as a function of the mobile magnetic objects that need to be located. This makes it possible to preserve the flexibility of the method while improving the precision of location.

Moreover, when the number of variables for which a value needs to be estimated in step b) is small, the method of location is faster.

The above method does not require the storage of a large number of predefined systems of equations, but rather simply an initial system of equations and supplementary equations.

Finally, decreasing the number of variables to be estimated also allows an increase in the robustness of the method.

The embodiments of said method may have one or more of the features of the dependent claims.

Moreover, said embodiments of the method of location exhibit the following advantages:
  using the previously estimated values in order to identify the supplementary equation allows the use of the magnetometers both for locating the magnetic objects and for selecting the supplementary equation,
  in the absence of variation in one of the variables, establishing the supplementary equation according to which said variable is equal to a constant value allows a decrease in the number of variables to be estimated without for that purpose using prerecorded knowledge about the possible behaviour(s) of said variable,
  using a threshold to determine whether a variable varies, said threshold being determined on the basis of the maximum variation observed for said variable, allows an increase in the precision of the method,
  the identification of a supplementary equation by comparing the distinctive features of a mobile object with prerecorded selected conditions allows limitation of the number of variables to be estimated by taking account of a predefined knowledge base about the possible movements of the mobile magnetic objects,
  obtaining the distinctive feature on the basis of the measurements performed by the network of magnetometers allows identification of the supplementary equation by using the same magnetometers as those used for locating the mobile magnetic object;
  re-adding a variable to the current system of equations when the estimation error exceeds a certain threshold allows automatic adaptation of the method to a change of mobile magnetic object or to a change in the use thereof;
  selecting the variable to be reintroduced into the current system of equations on the basis of the calculated estimation error in the event of said variable being absent from the system of equations and in the event of said variable being present in the system of equations allows a systematic decrease in the error each time that a variable is reintroduced into the system of equations.

The invention likewise relates to an information recording medium having instructions for the execution of the above method when said instructions are executed by an electronic computer.

Finally, the invention likewise relates to a device for locating mobile magnetic objects according to Claim 9.

The invention will be better understood upon reading the description that follows, provided merely by way of non-limiting example and with reference to the drawings.

DETAILED DESCRIPTION

In the figures, the same references are used to denote the same elements.

In the remainder of this description, the features and functions that are well known to a person skilled in the art are not described in detail.

Figure 1:
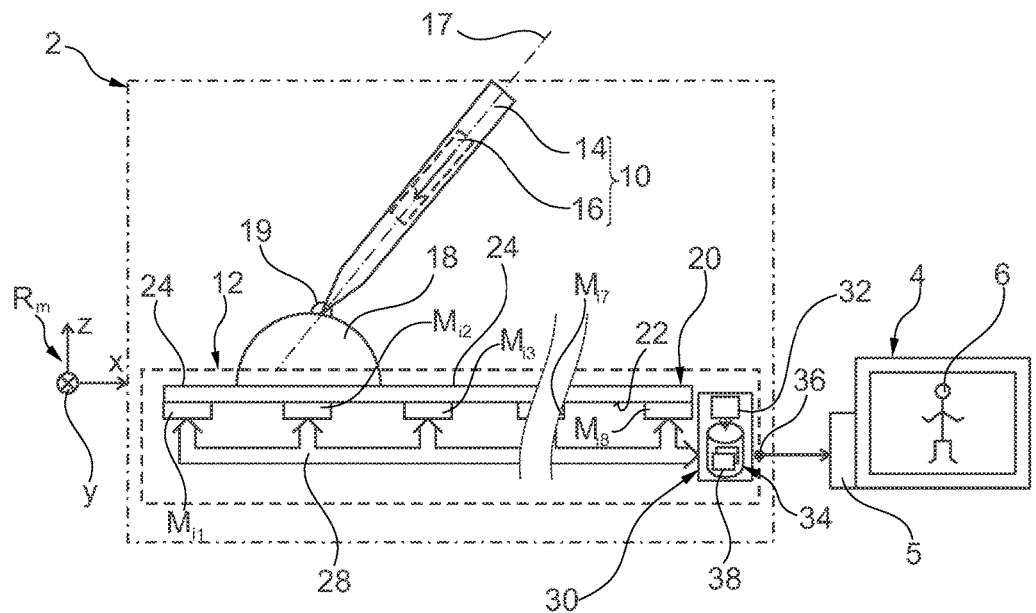
FIG. 1 is a schematic illustration of a man/machine interface allowing control of an electrical appliance.

FIG. 1 shows a man/machine interface 2 allowing the control of an electrical appliance 4. In this case, the electrical appliance has a screen and a control unit 5 capable of controlling the display of an image on said screen.

In this case, the operation of the interface 2 is illustrated in the case where the unit 5 is a video games console. By way of example, the unit 5 controls the movement of a FIG. 6 on the screen. However the interface 2 can be used in numerous other applications as described at the end of this description.

The interface 2 has a plurality of utensils that can be actuated directly manually by a human being, subsequently called the "user". Each of said utensils has at least one magnetic object. In this case, each magnetic object is a permanent magnet. To simplify FIG. 1, only one utensil 10 is shown in this figure. Other utensils of an interface 2 are described with reference to FIGS. 3 and 4. The interface 2 likewise has a device 12 for locating each permanent magnet.

In this embodiment, to modify the configuration of the interface 2, each utensil can be displaced freely, directly by the hand of the user, in an orthogonal reference frame Rm that is fixed without any degree of freedom to the device 12. In this case, the X and Y directions of the reference frame Rm are horizontal and the Z direction is vertical. To this end, each utensil weighs less than one kilo and, preferably, less than 200 g. The dimensions of each utensil are sufficiently small for it to be able to be grasped and moved by a single hand of the user.

In this embodiment, the utensil 10 comprises a lever 14, a permanent magnet 16 and a support 18. The lever 14 has an oblong shape to form a grip that can easily be grasped by the user. It extends along a longitudinal axis 17. The lever 14 is intended to be used as a joystick. To this end, a lower end of the lever 14 is fixed to the support 18 by means of a ball joint 19. The support 18 is provided with a lower planar face that is intended to be fixed or to rest on a plane so as to immobilise, in the reference frame Rm, the position of the ball joint 19 when the utensil 10 is in use. Thus, the lever 14 can be inclined freely by the user around the centre of rotation of the ball joint 19. During use, the lever 14 therefore exhibits three degrees of rotational freedom.

By way of example, the lever 14, the support 18 and the ball joint 19 are made entirely of a nonmagnetic material, that is to say a material that does not exhibit any magnetic property that can be measured by the device 12. This material is plastic, for example. The position of the lever 14 about the X, Y and Z axes is located on the basis of the position of the magnet 16. The magnet 16 exhibits a non-zero magnetic moment even in the absence of an external magnetic field.

Typically, in this description, the coercive magnetic field of each magnet is greater than 100 A·m$^{-1}$ or 500 A·m$^{-1}$. By way of example, the magnet is made of ferromagnetic or ferrimagnetic material. The power of each permanent magnet is typically greater than 0.01 A·m$^2$ or 0.1 A·m$^2$.

The magnet 16 is fixed without any degree of freedom to the lever 14. The direction of the magnetic moment of the magnet 16 coincides in this case with the longitudinal axis 17 of the lever 14. In FIG. 1 and those that follow, the direction of the magnetic moment of a magnet is shown by an arrow. The greatest length of said magnet is denoted by L hereinafter.

When the lever 14 is used, the coordinates of the magnet 16 are connected to one another by the following vectorial relationship: P+Rd*(M/‖M‖)=P$_0$, where:

P$_0$ is the vector coding the position of the centre of rotation of the ball joint 19 of the utensil 10 in the reference frame Rm, P is the vector coding the position of the geometric centre of the magnet 16 in the reference Rm, M is the magnetic moment of the magnet 16, ‖M‖ is the amplitude of the magnetic moment M, Rd is the distance that separates the centre of rotation of the ball joint 19 from the geometric centre of the magnet 16.

On the basis of this vectorial relationship, it is possible to establish three supplementary equations connecting together the variables coding the position, the orientation and the amplitude of the magnetic moment of the magnet 16. By way of example, the supplementary equations are as follows:

$$\frac{-Rd * Mx}{\sqrt{Mx^2 + My^2 + Mz^2}} = Px - Pox \quad (1)$$

$$\frac{-Rd * My}{\sqrt{Mx^2 + My^2 + Mz^2}} = Py - Poy \quad (2)$$

$$\frac{-Rd * Mz}{\sqrt{Mx^2 + My^2 + Mz^2}} = Pz - Poz \quad (3)$$

where:
- Mx, My and Mz are the orthogonal projections of the magnetic moment M on the X, Y and Z axes of the reference frame Rm,
- Px, Py, Pz are the coordinate of position P on the X, Y and Z axes of the reference frame Rm, and
- Pox, Poy, Poz are the coordinates of position $P_0$ on the X, Y and Z axes of the reference frame Rm.

These equations express the fact:
- that the geometric centre of the magnet 16 is always situated on a sphere centred on the centre of rotation of the ball joint 19 and of radius Rd, and
- that the magnetic moment of the magnet 16 points permanently to the centre of rotation of the ball joint 19.

The geometric centre of an object is the barycentre of all of the points of said object, assigning the same weight to each of said points.

To simplify the description, in the remainder of this description, the supplementary equations are expressed in a local reference frame that is linked without any degree of freedom to the utensil. It is within the scope of a person skilled in the art to express just these supplementary equations in the reference frame Rm by taking account of the coordinates and the orientation of the local reference frame in relation to the reference frame Rm. It is simply a matter of a change of reference frame.

The device 12 allows one or more magnets to be located in the reference frame Rm. In this case, location of a magnet is understood to mean the determination of the position and orientation of the magnet 16 in the reference frame Rm. The position is defined unambiguously by the values of three variables, for example the coordinates x, y and z in the reference frame Rm. More precisely, in the case of a magnet, the variables x and y and z are the coordinates of the geometric centre of the magnet. The orientation of the magnetic moment of a magnet is defined in the reference frame Rm by the values of two variables $\theta_y$ and $\theta_z$. In this case, the variables $\theta_y$ and $\theta_z$ are the angles of the magnetic moment of the magnet in relation to the Y and Z axes, respectively, of the reference frame Rm. The device 12 likewise determines a sixth variable A. The variable A is the amplitude of the magnetic moment of the magnet.

To this end, the device 12 has a network of N triaxial magnetometers $M_{ij}$. In FIG. 1, the wavy vertical lines indicate that a portion of the device 12 has not been shown.

Typically, N is greater than five and, preferably, greater than sixteen or thirty-two. In this case, N is greater than or equal to sixty-four.

In this embodiment, the magnetometers $M_{ij}$ are aligned in rows and columns to form a matrix. In this case, said matrix has eight rows and eight columns. The indexes i and j respectively identify the row and the column of said matrix at the intersection of which the magnetometer $M_{ij}$ is situated. In FIG. 1, only the magnetometers $M_{i1}$, $M_{i2}$, $M_{i3}$, $M_{i4}$ and $M_{i8}$ of a row i are visible. The position of the magnetometers $M_{ij}$ in relation to one another is described in more detail with reference to FIG. 2.

Each magnetometer $M_{ij}$ is fixed without any degree of freedom to the other magnetometers. To this end, the magnetometers $M_{ij}$ are fixed without any degree of freedom to a rear face 22 of a rigid plate 20. Said rigid plate exhibits a front face 24 turned toward the magnet 16. The plate 20 is made from a rigid non-magnetic material. By way of example, the plate 20 is made of glass.

Each magnetometer $M_{ij}$ measures the direction and the intensity of the magnetic field generated by the magnets that are present before the face 24. For this, each magnetometer $M_{ij}$ measures the norm (or amplitude) of the orthogonal projection of the magnetic field at said magnetometer $M_{ij}$ on three measurement axes of said magnetometer. In this case, said three measurement axes are orthogonal with respect to one another. By way of example, the measurement axes of each of the magnetometers $M_{ij}$ are respectively parallel to the X, Y and Z axes of the reference frame. The sensitivity of the magnetometer $M_{ij}$ is $4*10^{-7}$ T.

Each magnetometer $M_{ij}$ is connected to a processing unit 30 by means of a bus 28 for transmitting information.

The processing unit 30 is capable, for each magnet, of locating said magnet in the reference frame Rm and of estimating the amplitude of its magnetic moment on the basis of the measurements from the magnetometers $M_{ij}$. To this end, the unit 30 has a programmable electronic computer 32 that is capable of executing instructions recorded on an information recording medium. The unit 30 therefore also has a memory 34 containing the instructions that are necessary for the execution of the method from FIG. 6 by the computer 32. In this embodiment, for each number P of magnetic objects that are likely to be simultaneously used in the interface 2, the unit 30 implements a mathematical model $M_P$ associating each measurement from a magnetometer $M_{ij}$ with the positions, orientations and amplitudes of the magnetic moments of P magnetic objects in the reference frame Rm. Each model $M_P$ presents itself in the form of a system of equations in which a first set of variables represents the positions and orientations of the P magnetic objects and the amplitudes of the magnetic moments of said objects. A second set of variables represents the measurements from the magnetometers $M_{ij}$. In order to obtain the positions, orientations and amplitudes of the magnetic moments of the P magnetic objects, the variables in the first set are the unknowns and the values of the variables in the second set are known. This model is typically constructed on the basis of the physical equations of magnetism. Said model is parametrized by the known distances between the magnetometers $M_{ij}$. In this case, the magnetic objects are the permanent magnets. To construct this model, each permanent magnet is approximated by a magnetic dipole. This approximation introduces only very few errors if the distance between the permanent magnet and the magnetometer $M_{ij}$ is greater than 2L and, preferably, greater than 3L, where L is the greatest dimension of the permanent magnet. Typically, L is less than 20 cm and, preferably, less than 10 or 5 cm.

In this case, the model $M_P$ is nonlinear. The unit 30 resolves it by implementing an algorithm for estimating the solution thereto. By way of example, the algorithm used is an "Unscented Kalman Filter".

Given that each magnetic object is characterized by three variables to know its position, two variables to know its orientation and one variable to know the amplitude of its magnetic moment, the maximum number of magnetic objects that can simultaneously be located by the network of N magnetometers is less than N/2. Consequently, the value of the number P is less than or equal to N/2 and, preferably, less than N/5 or N/10 or N/20 in order to have redundant measurements. The redundancy of the measurements allows the precision of the location of the magnetic objects to be improved.

In this embodiment, only five mathematical models $M_1$, $M_2$, $M_3$, $M_4$ and $M_5$ are implemented in the unit 30 for, respectively, 1, 2, 3, 4 and 5 permanent magnets that are simultaneously present before the face 24.

The unit 30 is likewise capable of transmitting a command to the appliance 4 by means of an interface 36 connected to said appliance 4.

The memory 34 also has a database 38 that records a plurality of command rules for the appliance 4. Each command rule allows generation of the command for the appliance 4 that corresponds to the current state of the utensil with which it is associated. To this end, each command rule associates:
- a command for the appliance 4 with at least one possible state of the utensil, and
- another command for the appliance 4 or an absence of command for the appliance 4 with another possible state of the same utensil.

The command rule therefore determines how the appliance 4 works in response to the actuation, by the user, of the utensil that is associated with said command rule. Said base 38 is described in more detail with reference to FIG. 5.

Figure 2:
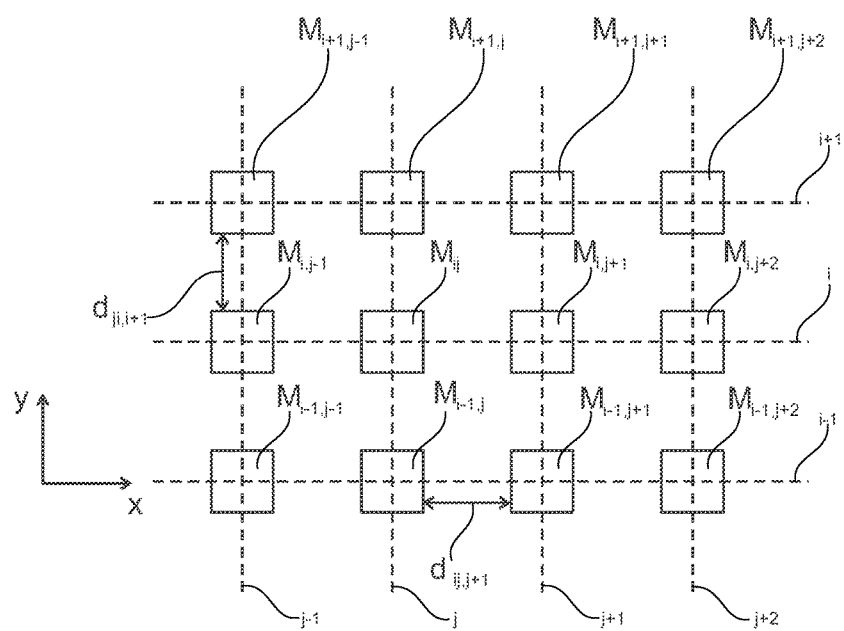
FIG. 2 is a partial illustration, in plan view, of a network of magnetometers that is implemented in the man/machine interface in FIG. 1.

FIG. 2 shows some of the magnetometers $M_{ij}$ of the device 12. Said magnetometers $M_{ij}$ are aligned in rows i parallel to the direction X. Said magnetometers are likewise aligned in columns j parallel to the direction Y to form a matrix. The rows i and the columns j are disposed in the order of increasing indexes.

The centre of the magnetometer $M_{ij}$ is situated at the intersection between the row i and the column j. The centre of the magnetometer corresponds to the point at which the magnetic field is measured by said magnetometer. In this case, the indexes i and j belong to the range [1; 8].

The centres of two magnetometers $M_{ij}$ and $M_{i,j+1}$ that are immediately consecutive along a row i are separated by a known distance $d_{i,j,j+1}$. Similarly, the centre of two magnetometers $M_{ij}$ and $M_{i+1,j}$ that are immediately consecutive along one and the same column j are separated by a known distance $d_{j,i,i+1}$.

In the particular case described here, whatever the row i, the distance $d_{i,j,j+1}$ is the same. This distance is therefore denoted $d_j$. Similarly, whatever the column j, the distance $d_{i,j,i+1}$ between two magnetometers is the same. This distance is therefore denoted $d_i$.

In this case, the distances $d_i$ and $d_j$ are both equal to d.

Typically, the distance d is shorter than, and preferably twice as short as, the shortest distance that can exist between two magnetic objects that are simultaneously present before the face 24 during normal use of the interface 2. In this case, the distance d is between 1 and 4 cm when:
- the power of the permanent magnet is 0.5 A·m$^2$,
- the sensitivity of the magnetometers is 4*10$^{-7}$ T, and
- the number of magnetometers $M_{ij}$ is sixty-four.

Figure 3:
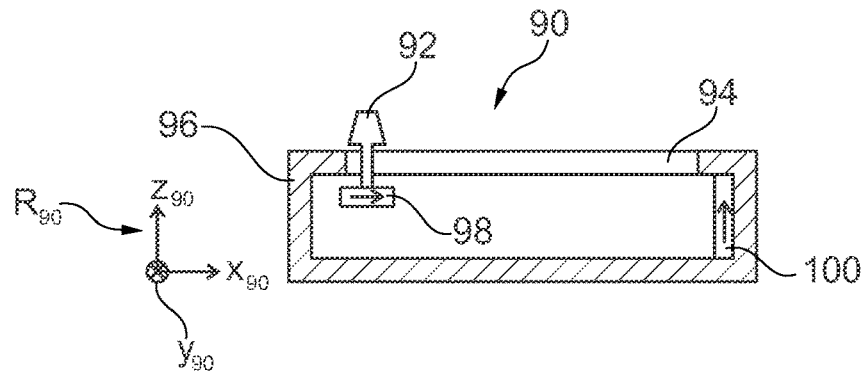
FIG. 3 is a schematic illustration, in vertical section, of a slider that can be used in the interface in FIG. 1.
Figure 4:
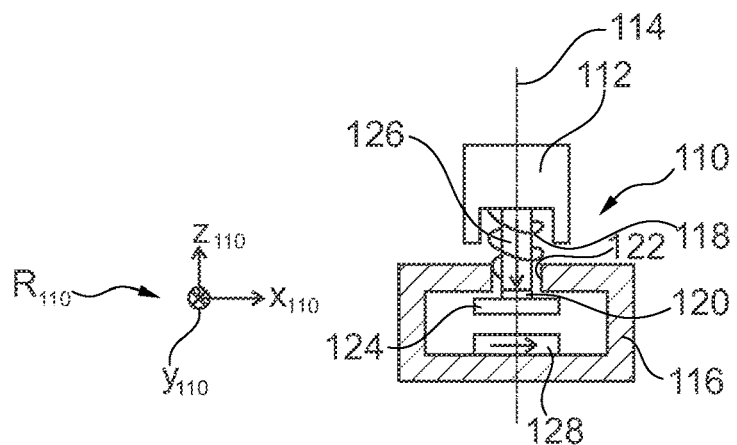
FIG. 4 is a schematic illustration, in vertical section, of a button that can be used in the interface in FIG. 1.

FIGS. 3 and 4 show other utensils that can be used instead of the utensil 10 or at the same time as the utensil 10 in the interface 2.

FIG. 3 shows a slider 90. Said slider allows, by way of example, the value of a parameter of the appliance 4 to be regulated. To this end, said slider 90 has a slide element 92 mounted so as to be translationally movable in a rectilinear slot 94 made in an upper face of a case 96. The user can manually slide the slide element 92 in order to modify the state of the slider 90. In the case of the slider 90, each state corresponds to a particular position of the slide element 92 along the slot 94.

In order to measure the position of the slide element 92 along the slot 94, the slider 90 is equipped:
- with a permanent magnet 98 fixed without any degree of freedom to the slide element 92, and
- with a permanent magnet 100 fixed without any degree of freedom to the case 96.

A local orthogonal reference frame $R_{90}$ is defined that is linked without any degree of freedom to the case 96 and in which:
- the axis $X_{90}$ is parallel to the slot 92,
- the axis $Y_{90}$ is parallel to the bottom of the case 96,
- the axis $Z_{90}$ is perpendicular to the bottom of the case 96, and
- the origin coincides with the geometric centre of the magnet 100.

For reasons of clarity, the reference frame $R_{90}$ is shown next to the slider 90 in FIG. 3.

In this embodiment, the direction of the magnetic moment of the magnet 98 is parallel to the direction $X_{90}$. The direction of the magnetic moment of the magnet 100 is parallel to the direction $Z_{90}$.

The number for the degree of freedom of the slider 92 in relation to the case 96 is limited to a translational degree of freedom along the axis $X_{90}$. In these conditions, the following supplementary equations exist between the coordinates of the magnets 98 and 100 in the reference frame $R_{90}$: $z_{98}=z_{100}+h_{98}$ and $y_{98}=y_{100}$, where:
- $x_{98}$, $y_{98}$, $z_{98}$ are the coordinates in the reference frame $R_{90}$ of the geometric centre of the magnet 98,
- $x_{100}$, $y_{100}$, $z_{100}$ are the coordinates in the reference frame $R_{90}$ of the geometric centre of the magnet 100,
- $h_{98}$ is a known constant numerical value that is the function of the dimensions of the utensil 90.

There are likewise the following supplementary equations: $\theta_{y98}=\theta_{y100}$ and $\theta_{z100}=\theta_{z98}+90°$, where:
- $\theta_{y98}$ and $\theta_{z98}$ are the angles between the direction of the magnetic moment of the magnet 98 and the axes $y_{90}$ and $z_{90}$, and
- $\theta_{y100}$ and $\theta_{z100}$ are the angles between the direction of the magnetic moment of the magnet 100 and the axes $y_{90}$ and $z_{90}$.

The amplitudes of the magnetic moments of the magnets 98 and 100 are unique in the interface 2 and different from one another.

FIG. 4 shows a button 110. Said button 110 can be moved manually by a user between a rest state (shown in FIG. 4) and a pushed-in state. Typically, the button 110 is intended to trigger an action from the appliance 4 only when it reaches its pushed-in state.

Said button 110 has a key 112 that can only be moved translationally, along an axis 114 integral with a case 116, between a rest position (shown in FIG. 4) and a pushed-in position. In FIG. 4, the axis 114 is vertical. The rest and pushed-in states correspond to the rest and pushed-in positions, respectively, of the key 112.

The button 110 has a spring 118 interposed between a lower portion of the button 112 and an upper face of the case 116. A rectilinear stem 120 extends along the axis 114, one end of said stem 120 being fixed, without any degree of freedom, to the key 112 and the other end of said stem being fixed to a stop 124. Said stem 120 is mounted so as to slide inside an orifice 122 made in the upper face of the case 116. The stop 124 allows the lower end of said stem 120 to be retrained inside the case 116.

In order to determine the state that the button 110 is in, the stem 120 has a permanent magnet 126 fixed without any degree of freedom to said stem. In this embodiment, the direction of the magnetic moment of the magnet 126 coincides with the axis 114. Another permanent magnet 128 is likewise fixed without any degree of freedom to the bottom of the case 116.

Consequently, the state that the button 110 is in can be established on the basis of the relative position of the magnet 126 in relation to the magnet 128. By way of example, the state is established on the basis of the value of a distance $d_{110}$ and a threshold $S_0$. The distance $d_{110}$ is the shortest distance that separates the geometric centres of the magnets 126 and 128. The threshold $S_0$ is used in order to distinguish the pushed-in state from the rest state. If the distance $d_{110}$ is below the threshold $S_0$ this means that the button 110 is in its pushed-in state. Conversely, if the distance $d_{110}$ is above said threshold $S_0$, the button 110 is in its rest state.

A local orthogonal reference frame $R_{110}$ is defined that is fixed without any degree of freedom to the button 110. For reasons of clarity, it is shown next to the button 110 in FIG. 4. The origin of the reference frame $R_{110}$ coincides with the geometric centre of the magnet 128. The axes $X_{110}$ and $Z_{110}$ of said reference frame $R_{110}$ coincide with the directions of the magnetic moments of the magnets 128 and 126, respectively. The axis $Z_{110}$ of said reference frame $R_{110}$ therefore coincides with the axis 114.

The magnet 126 has only a single degree of translational freedom in relation to the magnet 128. In these conditions, the following supplementary equations connect together the coordinates of the magnets 126 and 128 in the reference frame $R_{110}$: $x_{126}=x_{128}$, $y_{126}=y_{128}$, $\theta_{Y126}=\theta_{Y128}$, and $\theta_{Z126}=\theta_{Z128}+90°$, where:
- $x_{126}$, $y_{126}$, $z_{126}$ are the coordinates in the reference frame $R_{110}$ of the geometric centre of the magnet 126,
- $x_{128}$, $y_{128}$, $z_{128}$ are the coordinates in the reference frame $R_{110}$ of the geometric centre of the magnet 128.

In this case, the magnets 126 and 128 are identical.

Figure 5:
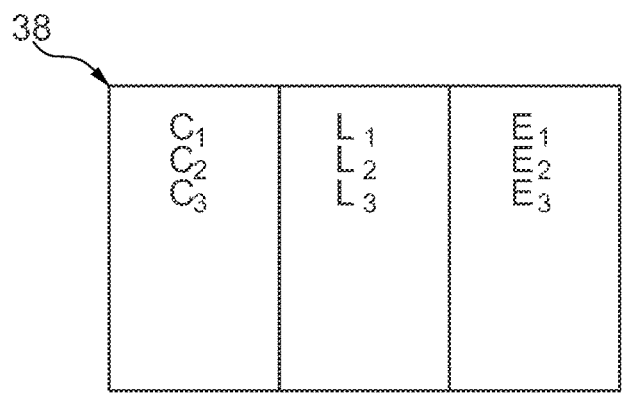
FIG. 5 is a schematic illustration of a database used in the interface in FIG. 1.

FIG. 5 shows the database 38. Said base 38 has, for each utensil $U_i$:
- a selection condition $C_i$ allowing the selection, on the basis of a distinctive feature of the utensil $U_i$, only of said utensil $U_i$ and not of the other utensils having an arrangement of magnets that are different and likely to be used in the interface 2,
- a prerecorded command rule $L_i$,
- an ensemble $E_i$ of supplementary equations defining the predetermined relationship(s) that exist(s) between the coordinates and the orientations of the magnetic moments of the magnets of said utensil.

It is subsequently assumed that the distinctive feature of each utensil is the amplitude of the magnetic moment(s) of its permanent magnets.

Preferably, the selection condition is expressed in the form of a range of values to which the distinctive feature of the utensil must belong in order to be verified.

If the condition $C_i$ is verified by a permanent magnet or a pair of permanent magnets, then the rule $L_i$ and the ensemble $E_i$ are associated with the utensil equipped with said magnet or pair of magnets. The index "i" identifies the rule $L_i$ and the ensemble $E_i$ that are associated with said condition $C_i$ by the base 38. In this case, each condition $C_i$ relates to the values of the variables that are estimated for the permanent magnets with which a utensil is equipped and that, generally, are not used in order to establish the state that said utensil is currently in.

By way of illustration, an example of content of the base 38 will now be described.

The rule $L_1$ is a command rule that uses only the values of the variables $\theta_Y$ and $\theta_Z$. More precisely, it transforms each value of the angles $\theta_Y$ and $\theta_Z$ into a respective command for the appliance 4. By way of example, said command can prompt the FIG. 6 to move in a direction specified by the values $\theta_Y$ and $\theta_Z$.

Said rule $L_1$ is associated with the condition $C_1$. The condition $C_1$ is as follows: the value of the variable A must be between $S_1$ and $S_2$, where $S_1$ and $S_2$ are predefined limits such that only the amplitude of the magnetic moment of the magnet 16 is between said limits. Said rule $L_1$ is therefore intended to be associated with the utensil 10. If the device 12 determines that the value of the variable A of a permanent magnet is between $S_1$ and $S_2$, then it uses the rule $L_1$ to convert the values of the angles $\theta_Y$ and $\theta_Z$ of this very magnet into a command for the appliance 4. Consequently, by modifying the inclination of the utensil 10, it is possible to control the appliance 4. This continues to be true whatever the position of the utensil 10 in relation to the device 12 from the moment at which the presence of the magnet 16 can be detected. The location of the utensil 10 can therefore be chosen freely by the user, which corresponds to an infinite number of possible of configurations for the interface 2. The ensemble $E_1$ has the supplementary equation described with reference to FIG. 1.

The rule $L_2$ is a command rule that uses the value of a distance between two permanent magnets in order to generate a command for regulating a parameter of the appliance 4 as a function of said distance. Said rule $L_2$ specifies that the distance is measured between:
- a permanent magnet for which the amplitude of the magnetic moment is between limits $S_{71}$ and $S_{81}$ predefined such that only the magnet 98 is able to satisfy said condition, and
- a permanent magnet for which the amplitude of the magnetic moment is between limits $S_{72}$ and $S_{82}$ predefined such that only the magnet 100 is able to satisfy said condition.

Said command rule is typically designed to be associated with the slider 90 so that the distance corresponds to the distance $d_{90}$. To this end, the rule $L_2$ is associated with a condition $C_2$. Said condition $C_2$ is as follows: the value of the variable A of a permanent magnet is between the limits $S_{72}$ and $S_{82}$.

With such a condition $C_2$, the rule $L_2$ is associated with the slider 90. The ensemble $E_2$ has the supplementary equations described with reference to FIG. 3.

The rule $L_3$ is a command rule that uses only the shortest distance between two identical permanent magnets in order to generate a command for the appliance 4. In this case, the rule $L_3$ is intended to be associated with the button 110 so that the shortest distance corresponds to the distance $d_{110}$. By way of example, the command rule $L_3$ is as follows:
- if the distance $d_{110}$ is above the threshold $S_0$, then the unit 30 does not generate any command for the appliance 4, and
- if the distance $d_{110}$ is below or equal to the threshold $S_0$, then the unit 30 generates and transmits a command to the appliance 4.

The rule $L_3$ is associated with the condition $C_3$. In this case, said condition $C_3$ is as follows:
- the values of the variables A of two distinct permanent magnets are both between limits $S_9$ and $S_{10}$, and
- the shortest distance between said two magnets is below a threshold $D_{max110}$.

The limits $S_9$ and $S_{10}$ are constants predefined such that only the amplitude of the magnetic moment of the magnets 126 and 128 is between said limits. The value of the threshold $D_{max110}$ is chosen to be equal to the greatest possible value of the distance $d_{110}$. The ensemble $E_3$ has the supplementary equations described with reference to FIG. 4.

The operation of the interface 2 will now be described in more detail with reference to the method of FIG. 6.

Said method begins with an initialisation phase 140 during which the rules $L_i$, the ensembles $E_i$ and the conditions $C_i$ are recorded in the base 38.

Next, a configuration phase 142 for the interface 2 is carried out. During this phase 142, the user chooses one or more utensils among the utensils 10, 90 and 110. In this case, it is supposed that he has only a single copy of the utensil 10 and two copies of the utensils 90 and 110. Next, he arranges them freely on the face 24 of the device 12. Moreover, he ensures that the configuration produced does not result in there simultaneously being more than five permanent magnets before the face 24. The man/machine interface 2 is then configured. The rest of this description is provided in the particular case in which the user has arranged one copy of each of the utensils 10, 90 and 110 on the face 24.

It is then possible to start using said interface 2 to control the appliance 4.

This begins with a step 146 during which the magnetometers $M_{ij}$ simultaneously measure the magnetic field of the magnet(s) simultaneously present before the face 24.

Next, in a step 148, the unit 30 takes the measurements on the magnetometers $M_{ij}$ as a basis for estimating the position, orientation and amplitude of the magnetic moment of each of the magnets that are present.

For this, during an operation 150, the unit 30 resolves the system of equations of the model $M_1$ for a magnetic dipole. It obtains a set of coordinates $x_1$, $y_1$, $z_1$, $\theta_1$ and $\varphi_1$ and an amplitude $A_1$ corresponding to the estimation of the position, the orientation and the amplitude of a single permanent magnet.

Next, during an operation 152, the unit 30 calculates an estimation error $E_1$ that is representative of the difference between:
- estimated values of the measurements from the magnetometers, calculated on the basis of the system of equations $M_1$ and on the basis of the position, orientation and amplitude that are obtained at the end of the operation 150, and
- the measurements from the magnetometers taken in step 146.

The error is estimated for each magnetometer. In this case, the overall estimation error resulting from the use of the model $M_1$ is obtained by averaging the errors calculated for each of the magnetometers, for example.

In the case in which the algorithm used to resolve the model is an unscended or extended Kalman filter, the resolution of this system of equations during the operation 150 likewise provides an estimate of said error $E_1$.

Steps 150 and 152 are carried out for P=1 to P=5. Preferably, steps 150 and 152 for each value of P are carried out in parallel.

Next, during an operation 154, the unit 30 selects the model $M_P$ that provides the smallest error $E_P$. Thus, if there is only a single permanent magnet before the face 24, the unit 30 automatically selects the model $M_1$. If, by contrast, there are two permanent magnets, the unit 30 automatically selects the model $M_2$ and so on. In this case, it is the model $M_5$ that is automatically selected because the interface 2 has five permanent magnets. This model $M_5$ has thirty variables, the values of which are unknown.

At the end of this step 148, the computer has a first estimate of the values of the variables x, y, z, $\theta_Y$, $\theta_Z$ and A for each of five magnets. This first estimate is the one obtained following the execution of the operation 150 using the model $M_5$.

Step 148 then continues with a first phase 166 of automatic adaptation of the model $M_5$ to the configuration produced by the user in step 142.

Said phase 166 begins with a step 168 of identification of the ensembles $E_i$ that can be used to reduce the number of variables to be estimated in the model $M_5$. To this end, in step 168, the computer 32 identifies the utensils that are present before the face 24.

By way of example, during an operation 170, the computer acquires the distinctive feature of each utensil that is present before the face 24. In this case, said distinctive feature is obtained on the basis of the preceding estimation of the position, orientation and amplitude of each permanent magnet. In this particular case, said distinctive feature is either the amplitude of the estimated magnetic moment of a permanent magnet or the estimated amplitudes of the magnetic moments of a pair of permanent magnets. By way of example, the estimated amplitudes are those estimated during the execution of the operation 150 with the model $M_5$.

Next, during an operation 172, the computer 32 compares each distinctive feature acquired with each condition $C_i$ of the base 38.

If the distinctive feature acquired corresponds to one of the conditions $C_i$, then, during an operation 176, a utensil is identified. Each time a utensil is identified, an identifier for said utensil is added to a list of identified utensils. Said list of identified utensils likewise contains for each identified utensil the ensemble $E_i$ and the rule $L_i$ that are associated with said utensil by the base 38.

If the distinctive feature acquired does not correspond to any of the conditions $C_i$, then the utensil is not identified.

At the end of step 168, the supplementary equations that can be used for decreasing the number of variables of the model $M_5$ are therefore identified. However, each of said supplementary equations, which is expressed in the reference Rm, is dependent on the coordinates of the origin and on the orientation of the axes of the local reference frame in relation to the reference frame Rm.

Consequently, the method continues in a step 178 during which, for the local reference frame of each identified utensil, the computer 32 determines:
- the position of its origin in the reference frame Rm, and if necessary
- the orientation of its axes in the reference frame Rm.

For this, the computer 32 uses the estimated position and orientation of the permanent magnet(s) of the utensil in the reference frame Rm and prerecorded information about the position of the local reference frame in relation to the permanent magnets of said utensil.

By way of example, in the case of the utensil 10, the position of the origin of the reference frame $R_{10}$ is determined by translating the estimated position of the magnet 16 in the reference frame Rm of a distance Rd in the direction of its magnetic moment and by moving it closer to the face 24.

In the case of the utensil 90, the position of the origin of the reference frame $R_{90}$ in the reference frame Rm is equal to the estimated position of the geometric centre of the permanent magnet 100. The orientations of the axes $Z_{90}$ and $X_{90}$ are equal to the estimated orientations of the magnetic moments of the magnets 100 and 98, respectively.

Similarly, the computer 32 determines the position and orientation of the local reference frame $R_{110}$.

At the end of step 178, each of the supplementary equations identified expresses an equality between a first variable of the model $M_5$ and a term. The value of said term is expressed by means of one or more other variables of the model $M_5$ that are different from the first variable. Typically, these other variables of the model $M_5$ are those that code the position and orientation of the permanent magnets of the same utensil.

Next, for each supplementary equation, in a step 180, the computer 32 replaces, in the current system of equations of the model $M_5$, the first variable with the term to which it is equal. Thus, the end of step 180 provides a new system of equations and therefore a new current model, denoted $M_{5c}$, having fewer variables to be estimated than the current system. For the steps that follow, the system of equations of the model $M_{5c}$ becomes the current system of equations.

More precisely, the initial model $M_5$ is as generic model that allows simultaneous location of five permanent magnets without taking account of the mechanical relationships that can exist between said permanent magnets. Said model $M_5$ is therefore a system of equations that has thirty variables to be estimated. Following the execution of step 180, the new model $M_{5c}$ is a specific model that is dependent on the utensils currently arranged on the face 24. Said model $M_{5c}$ notably takes account of the mechanical relationships that limit the number of degrees of freedom of movement for the permanent magnets in relation to one another. It therefore has fewer variables to be estimated than the model $M_5$. By way of example, in this case, the model $M_{5c}$ has only 19 variables to be estimated instead of thirty. The reason is that, before even having determined whether or not the utensils 10, 90 and 110 are immobile in the reference frame Rm and having replaced their magnetic moment with constants, it is possible to simplify the current system of equations by using the three supplementary equations of the utensil 10 and the four supplementary equations of each of the utensils 90 and 110.

Subsequently, the replaced variables are calculated directly on the basis of the identified supplementary equations and the values estimated for the variables of the model $M_{5c}$.

The method continues with a step 190 during which the magnetometers $M_{ij}$ measure the magnetic field that is present.

In a step 192, the computer 32 acquires these measurements.

In a step 194, the computer 32 estimates the position and orientation of each permanent magnet by resolving the system of equations of the model $M_{5c}$. By way of example, said system of equations is resolved as described previously for the operation 150.

In a step 196, the computer 32 likewise calculates the current estimation error $E_{err}$ linked to the use of the model $M_{5c}$. Said error $E_{err}$ is calculated as described for the operation 150, except that it is the model $M_{5c}$ that is used.

Next, in a step 198, the error $E_{err}$ is compared with a predetermined threshold $S_{err}$. If the error $E_{err}$ is below this threshold $S_{err}$, then the computer 32 proceeds to a step 200.

In step 200, the selected rules $L_i$ and the positions and orientations estimated in step 194 are used in order to generate one or more commands that are transmitted to the appliance 4. Next, at the end of step 200, the method returns to step 190.

If the error $E_{err}$ is above the threshold $S_{err}$, then the procedure continues in a step 202 of reintroduction of one or more variables into the current model $M_{5c}$ in order to decrease said error $E_{err}$.

Step 202 can be carried out in numerous different ways. This is because there are numerous methods for reintroducing one or more variables into the current model so as to limit the error $E_{err}$. By way of example, a first method involves systematically returning to step 146. In this case, all of the steps from step 146 are reiterated each time the error $E_{err}$ exceeds the threshold $S_{err}$. This method has the advantage of allowing all of the variables of the models $M_1$ to $M_5$ to be reintroduced. Moreover, it is simple to implement.

A second method involves reintroducing the variables successively in the inverse order where they were eliminated from the current model. Thus, the computer 32 reintroduces the last variable eliminated into the current system of equations so as to obtain a new system of equations containing one variable more. Next, this new system of equations is used for the subsequent implementations of steps 192 to 198. This second method has the advantage that it is not necessary to systematically reiterate step 148 and the phase 166 of automatic adaptation of the model. Another advantage of this method is that the last variable fixed is the most likely to be modified.

A third method involves testing the reintroduction of each variable into the current model and reintroducing only the variable(s) that allow(s) the error $E_{err}$ to be decreased. By way of example, for this, the computer 32 first of all reintroduces a first variable into the current system of equations, then verifies whether the error $E_{err}$ calculated with the new system of equations obtained in this manner is below that obtained for the last iteration of step 196. If the error decreases, then this variable is selected. Conversely, if the error is not modified or, by contrast, increases, then this variable is not selected. The computer 32 thus tests each of the variables of the current model $M_{5c}$ in succession. Next, it reintroduces all the selected variables into the current model $M_{5c}$.

If the implementation of the second or third method leads to the reintroduction of all the variables into the current model and, despite that, the error $E_{err}$ remains above the threshold $S_{err}$, then the method returns to step 148. The reason is that this may signify that the increase in the error $E_{err}$ is then perhaps caused by the withdrawal or addition of a new utensil on the face 24, which modifies the number of permanent magnets that are present.

In parallel with steps 196 to 200, in a step 206, the user manipulates the utensils 10, 90 and 110 in order to control the appliance 4.

Likewise in parallel with steps 196 to 200, the computer 32 executes a second phase 210 of automatic adaptation of the current model.

This phase 210 begins with a step 211 of identification of a supplementary equation. In this case, in step 211, the supplementary equation is constructed and not obtained on the basis of prerecorded information about the mobile objects. For this, during an operation 212, the computer 32 calculates the amplitude of the variations in each variable of the model $M_{5c}$ in the course of the Q previous iterations of steps 190 to 194. Typically, Q is an integer greater than ten and preferably greater than one hundred or one thousand. By way of example, during the operation 212, the computer 32 calculates the variance of each of the variables of the model $M_{5c}$.

Next, during an operation 214, the computer 32 compares each calculated variance with a respective predetermined threshold $S_{var}$. By way of example, the threshold $S_{var}$ is equal to a fraction of the maximum variance measured in the past for this variable. By way of example, this threshold $S_{var}$ is taken to be equal to 10% or 5% or 1% of said maximum measured variance. The threshold $S_{var}$ may also be a predetermined numerical constant.

If the variance calculated during the operation 212 is above this threshold $S_{var}$, then the value of this variable is considered to vary and no new supplementary equation is considered to have been identified.

In the opposite case, the computer 32 considers this variable to be no longer varying, which allows a new supplementary equation to be established. This supplementary equation is a relationship of equality between said variable and a numerical constant. By way of example, the value of said numerical constant is taken to be equal to the mean of a plurality of the preceding values estimated for said variable or simply taken to be equal to the last value estimated for said variable.

Next, in a step 216, the variables that are considered to be constants are replaced in the model $M_{5c}$ with the values of said constants. A new system of equations is then obtained having even fewer variables than the current system of equations. This new system of equations is then used for the subsequent executions of steps 190 to 198. It therefore replaces the previous current system of equations.

Thus, the phase 210 allows the current model to be adapted by making use of the fact that, in practice, a degree of freedom for a utensil is not necessary used by the user. The supplementary equations constructed in this manner are added to the list of utensils and supplementary equations already identified. These variables eliminated during the phase 210 can be reintroduced into the system of equations in step 202.

When the user wishes to reconfigure the interface 2, he returns to the phase 142. During this new execution of the phase 142, he can modify the configuration of the interface 2, for example:

by removing or adding an utensil, and/or
by moving an utensil.

Thus, the interface 2 is easily configurable while continuing to be simple to produce.

Numerous other embodiments are possible. By way of example, the front face 24 is not necessarily planar. By way of example, as a variant, it has a relief form. Typically, this relief form may have hollow housings intended to receive and immobilize the utensils in said housings.

Other utensils than those described above can be provided and used in the interface 2. By way of example, reference may be made in this regard to the patent application FR1354160 filed on 7 May 2013 by the Commissariat à l'énergie atomique et aux énergies alternatives.

Numerous other distinctive features and associated selection conditions are conceivable. By way of example, when the utensil has K permanent magnets, with K strictly greater than one, the distinctive feature(s) of the utensil is/are chosen from the group made up of:

the relative position of the K permanent magnets in relation to one another,
the orientation of the magnetic moments of the K permanent magnets in relation to one another,
the amplitudes of the magnetic moments of the K permanent magnets or the relative amplitudes of the magnetic moments of the K permanent magnets in relation to one another.

When the distinctive feature is the position of a permanent magnet of a utensil in relation to the position of another permanent magnet of the same utensil, it is not necessary to use the amplitude of the magnetic moments in order to select the ensemble $E_i$ to be associated with said utensil.

When the utensil has only one permanent magnet, the distinctive feature of the utensil is the amplitude of the magnetic moment of its permanent magnet.

The distinctive feature may also be the position of a permanent magnet in the reference frame Rm. In this case, the selection condition verifies whether said permanent magnet is situated inside a predefined area in the reference frame Rm. If so, a command rule and an ensemble of supplementary equations are associated with said utensil. It is likewise possible to define conditions verifying whether the position of a magnet is not situated inside a predefined volume but rather is situated in a particular position in relation to a fixed point of the reference frame Rm or to a point whose position is defined by another permanent magnet that is distinct from the utensil.

The distinctive feature may also be the inclination of the magnetic moment of a permanent magnet in relation to a reference axis of the reference frame Rm, for example the vertical. In this case, the selection condition tests whether the estimated inclination of a magnetic moment of a permanent magnet of the utensil is in a predetermined range of values. If so, the computer identifies the ensemble $E_i$ of supplementary equations that is associated with said selection condition as allowing a reduction in the number of variables of the current system of equations.

The acquisition of a distinctive feature of an object can be effected differently from what has been described. By way of example, each object is equipped with an RFID (Radio Frequency Identification) tag. In this case, the device 12 moreover has an RFID tag reader. Thus, when a utensil is presented before the device 12, it is identified on the basis of the reading of the identifier of said utensil contained in its RFID tag. Next, said identifier is used to select, from a prerecorded database, the ensemble $E_i$ associated with said utensil. This very identifier can also be used to select the command rule(s) to be used with said utensil. Thus, the distinctive feature is not necessarily a feature obtained on the basis of the measurements from the magnetometers $M_{ij}$.

The acquisition of the distinctive feature is not necessarily automatic either. By way of example, as a variant, the user indicates the identifier of the added or removed object(s) by means of a man/machine interface.

In an embodiment in which the interface has just one or more identical copies of the same utensil, the selection conditions can be omitted. The reason is that, in this case, the ensemble $E_i$ of supplementary equations that is associated with each utensil is always the same. The database 38 can then contain just a single recording. It is simply sufficient to count the number of permanent magnets.

The database 38 does not necessarily contain, besides the ensembles $E_i$, the command rules $L_i$. By way of example, the base 38 contains only the conditions $C_i$ and the ensembles $E_i$ and another database contains conditions $C'_i$ and the rules $L_i$. In this case, the conditions $C_i$ and $C'_i$ are not necessarily the same. Thus, an ensemble $E_i$ is not necessarily and systematically associated with the same command rule.

If the number P of permanent magnets that are simultaneously present before the face 24 is known in advance, the control method can be simplified by using just the corresponding model $M_P$ in order to determine the position, the orientation and the amplitude of the magnetic moment of said P permanent magnets. By way of example, the number P of permanent magnets is input by the user during the configuration phase. Step 148 may therefore be simplified.

The change of configuration of the interface 2 is not necessarily made directly manually by a user. In another variant, the interface has electrical actuators allowing the configuration of the interface to be modified. By way of example, to this end, the movement of the utensils or the replacement of said utensils with other utensils is motorised, so that the user does not himself need to manipulate each of said utensils.

It is possible to limit the number of locations at which a utensil may be arranged in relation to the front face 24. For this purpose, the interface 2 has a plurality of locations, each equipped with keying for preventing a certain number of utensils from being fixed to said location and, by contrast, for authorising other, different utensils to be fixed to said location.

The approximation used in order to construct the model $M_P$ may also be a quaternary or higher approximation, that is to say that the magnetism equations are approximated to a higher order than that corresponding to dipole approximation.

Numerous different methods can be used in order to determine the position and orientation of the magnetic object. By way of example, the method described in U.S. Pat. No. 6,269,324 can be used. These methods do not necessarily use a Kalman filter. By way of example, the methods described in US2002/171427A1 or U.S. Pat. No. 6,263,230B1 are possible.

The magnetometers of the network of magnetometers are not necessarily arranged in columns and rows. They can also be arranged in other patterns. By way of example, the magnetometers are disposed at each crest of each triangular or hexagonal mesh in a meshing for a plane.

The arrangement of the magnetometers in relation to one another may also be random or irregular. Thus, the distance between two immediately consecutive magnetometers in the network is not necessarily the same for all the pairs of two immediately consecutive magnetometers. By way of example, the density of magnetometers in a given area of the network may be higher than elsewhere. Increasing the density in a given area can allow the precision of measurement in this area to be increased.

The network of magnetometers can also extend in three noncolinear directions in space. In these conditions, the magnetometers are distributed inside a three-dimensional volume.

The number N of magnetometers may likewise be greater than or equal to sixty-four or ninety.

All of the magnetometers in the network of magnetometers are not necessarily identical to one another. As a variant, the magnetometers do not all have the same sensitivity.

The appliance 4 can be replaced by any type of electrical appliance that needs to be controlled in response to an action from a human being. By way of example, the controlled appliance may be a robot, a machine tool or the like.

In all the embodiments described here, the permanent magnet can be replaced by a magnetic object that is not continually supplied with power and that acquires a magnetic moment in the presence of an external continuous magnetic field, such as the earth's magnetic field. By way of example, the permanent magnet is replaced by a piece of soft magnetic material. A magnetic material is considered soft if its coercive magnetic field is less than 10 or 1 $A \cdot m^{-1}$. Such a piece exhibits a magnetic moment created by the interaction between the earth's magnetic field and the piece of soft magnetic material.

Figure 6:
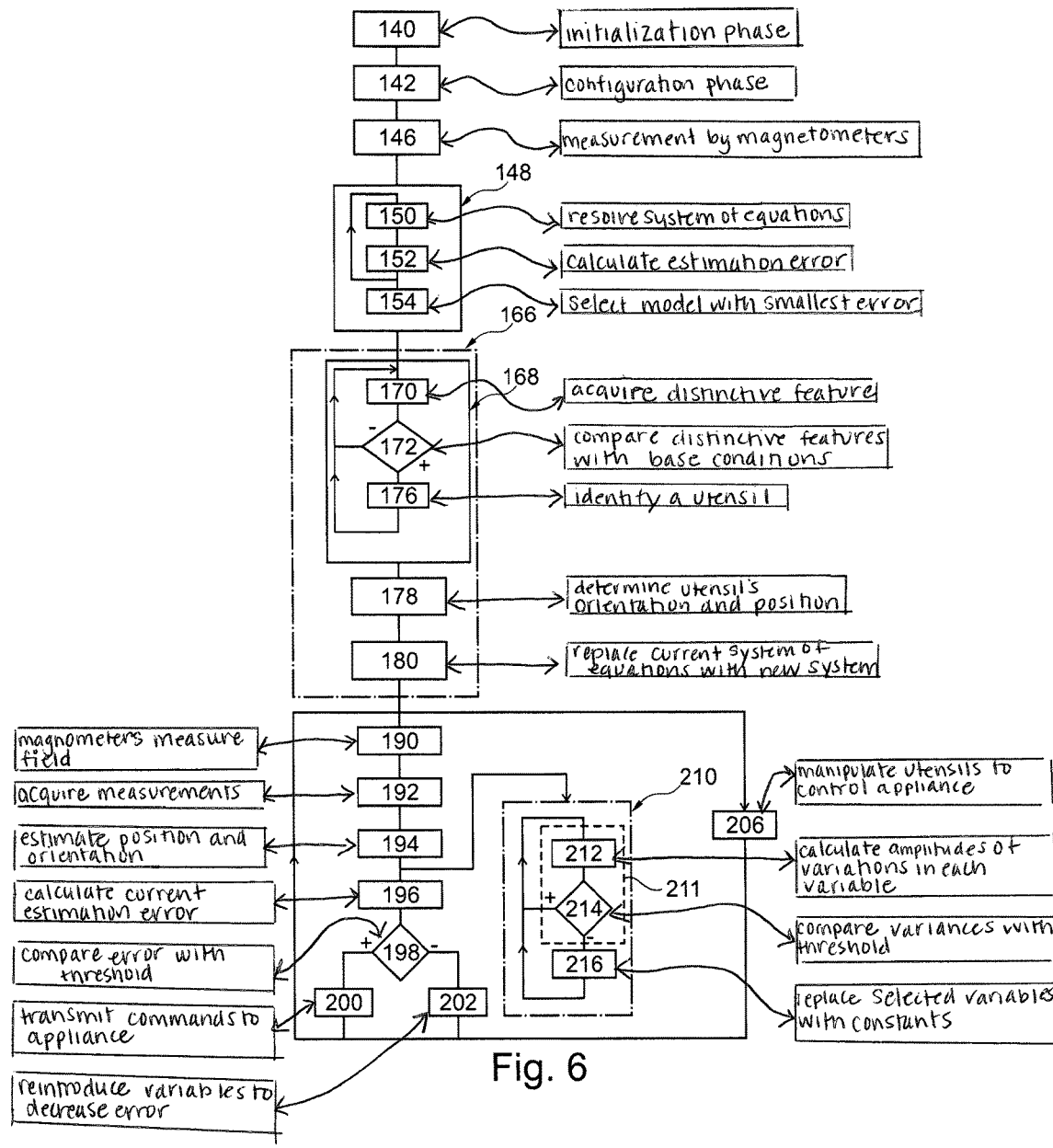
FIG. 6 is a flowchart for a method for controlling an electrical appliance using the man/machine interface in FIG. 1.

Numerous other embodiments of the method of FIG. 6 are possible. By way of example, one or other of phases 166 and 210 is omitted.

The number of measurements used in order to calculate the variance during the operation 212 may be a function of the duration of a sliding time window. Typically, only the measurements performed inside said sliding time window are taken into account in order to calculate the variance.

The invention claimed is:

1. A method comprising locating mobile magnetic objects presented before a network of at least five triaxial magnetometers that are mechanically connected to one another without any degree of freedom thereby preserving a known distance between each of said magnetometers, wherein locating said mobile magnetic objects comprises iterating execution of a first step and a second step, and, prior to each iteration, executing a third step, executing a fourth step, and executing a fifth step, wherein said first step comprises causing each of said magnetometers to measure an amplitude of a magnetic field along each of said measurement axes, wherein said second step comprises estimating, based on said measurements from said magnetometers, values of variables, wherein estimating said values of variables comprises resolving a first system of equations, thereby obtaining estimated values of each variable, wherein said first system of equations connects said variables to each measurement from each of said triaxial magnetometers, wherein each variable corresponds to one of a position, an orientation, and an amplitude of a magnetic moment of a magnetic object, wherein iterating execution of said first step and said second step comprises iterating execution at successive instants in time to obtain said estimated values of each variable at said successive instants, wherein said third step comprises identifying, based on said mobile objects presented before said magnetometers, a supplementary equation, wherein said supplementary equation defines a relationship of equality between a first variable and a term, wherein said first variable is from said first system of equations, wherein said term is selected from the group consisting of a predefined relationship between one or more other variables from said first system of equations and a constant numerical value, wherein said fourth step comprises replacing, in said first system of equations, said first variable with said term, thereby obtaining a second system of equations, wherein, said second system of equations possesses a first number of variables for which values need to be estimated, wherein said first system of equations possesses a second number of variables for which variables need to be estimated, wherein said first number is less than said second number, and wherein said fifth step comprises replacing said first system of equations with said second system of equations and repeating said first and second steps.

2. The method of claim 1, wherein identifying said supplementary equation comprises identifying said supplementary equation as a function of estimated values of said variables, said estimated values having been obtained from a previous iteration of said first and second steps.

3. The method of claim 2, wherein identifying said supplementary equation comprises calculating a magnitude that represents amplitude variations in said first variable during previous iterations of said first and second steps, comparing said calculated magnitude with a predetermined threshold to establish whether, during previous iterations of said first and second steps, variation in said first variable has crossed a predetermined threshold, if said predetermined threshold has been crossed, establishing a new supplementary equation, wherein said supplementary equation establishes a relationship of equality between a constant value and a value of said first variable, wherein said constant value is a function of at least one value of said first variable that is estimated at the time of said previous iterations of said first and second steps, in the course of which it has been established that the value of said first variable does not vary, and using said new supplementary equation in said fourth step, and if said predetermined threshold has not been crossed, refraining from establishing a new supplementary equation.

4. The method of claim 1, wherein said third step comprises acquiring a distinctive feature of the mobile magnetic object currently presented before the network of magnetometers, and comparing said acquired distinctive feature with selection conditions prerecorded in a database, wherein said database associates, with each selection condition, at least one supplementary equation that defines equality between a variable from said first system of equations and a term, wherein said term is selected from the group consisting of a predefined relationship between one or more other variables from the first system of equations and a constant numerical value, and only if the acquired distinctive feature corresponds to one of the prerecorded selection conditions, using said supplementary equation associated with said corresponding selection condition in said fourth step.

5. The method of claim 4, wherein acquiring said distinctive feature comprises obtaining said distinctive feature on the basis of the values of the variables estimated using said first system of equations.

6. The method of claim 1, further comprising calculating an estimation error with said first system of equations, wherein said estimation error represents a difference between estimated values of measurements obtained from magnetometers when the orientation and the amplitude of the magnetic moments are equal to those estimated using said first system of equations at the time of an iteration of said first and second steps, and measurements obtained from magnetometers during said first step concurrently with an iteration of said first and second steps, and if said calculated estimation error crosses a predetermined threshold, selecting at least one of the supplementary equations previously used in said fourth step to obtain said second of equations, and replacing, in said second system of equations, the term from the selected supplementary equation with the variable that said term has replaced in order to obtain a third system of equations in which the number of variables for which the value needs to be estimated is larger than the number of variables for which the value needs to be estimated in the second system of equations using said third system of equations instead of said second system of equations for the subsequent iterations of said first and second steps, otherwise, if said calculated error fails to cross said predetermined threshold, continuing to use said second system of equations for subsequent iterations of said first and second steps.

7. The method of claim 6, wherein selecting at least one supplementary equation comprises selecting at least two supplementary equations previously used in said fourth step to obtain said second system of equations, for each of the selected supplementary equations, replacing, in said second system of equations, the term from the selected supplementary equation with the variable that said term has replaced in order to obtain fourth and fifth different systems of equations, each of said fourth and fifth systems of equations having a number of variables for which the value needs to be estimated larger than the number of variables for which the value needs to be estimated in said second system of equations, calculating said estimation error with said fourth and fifth systems of equations, and selecting, from among those supplementary equations initially selected, that supplementary equation that minimizes said calculated estimation error to obtain said third system of equations.

8. A non-transitory computer-readable medium containing program instructions for locating mobile magnetic objects presented before a network of magnetometers having at least five triaxial magnetometers that are mechanically connected to one another without any degree of freedom in order to preserve a known distance between each of said magnetometers, wherein locating said mobile magnetic objects comprises iterating execution of a first step and a second step, and, prior to each iteration, executing a third step, executing a fourth step, and executing a fifth step, wherein said first step comprises causing each of said magnetometers to measure an amplitude of a magnetic field along each of said measurement axes, wherein said second step comprises estimating, based on said measurements from said magnetometers, values of variables, wherein estimating said values of variables comprises resolving a first system of equations, thereby obtaining estimated values of each variable, wherein said first system of equations connects said variables to each measurement from each of said triaxial magnetometers, wherein each variable corresponds to one of a position, an orientation, and an amplitude of a magnetic moment of a magnetic object, wherein iterating execution of said first step and said second step comprises iterating execution at successive instants in time to obtain said estimated values of each variable at said successive instants, wherein said third step comprises identifying, based on said mobile objects presented before said magnetometers, a supplementary equation, wherein said supplementary equation defines a relationship of equality between a first variable and a term, wherein said first variable is from said first system of equations, wherein said term is selected from the group consisting of a predefined relationship between one or more other variables from said first system of equations and a constant numerical value, wherein said fourth step comprises replacing, in said first system of equations, said first variable with said term, thereby obtaining a second system of equations, wherein, said second system of equations possesses a first number of variables for which values need to be estimated, wherein said first system of equations possesses a second number of variables for which variables need to be estimated, wherein said first number is less than said second number, and wherein said fifth step comprises replacing said first system of equations with said second system of equations and repeating said first and second steps.

9. An apparatus for locating mobile magnetic objects, said apparatus comprising a network of at least five triaxial magnetometers mechanically connected to one another without any degree of freedom in order to preserve a known distance between each of said magnetometers, and a processing unit configured to iterating execution of a first step and a second step, and, prior to each iteration, executing a third step, executing a fourth step, and executing a fifth step, wherein said first step comprises causing each of said magnetometers to measure an amplitude of a magnetic field along each of said measurement axes, wherein said second step comprises estimating, based on said measurements from said magnetometers, values of variables, wherein estimating said values of variables comprises resolving a first system of equations, thereby obtaining estimated values of each variable, wherein said first system of equations connects said variables to each measurement from each of said triaxial magnetometers, wherein each variable corresponds to one of a position, an orientation, and an amplitude of a magnetic moment of a magnetic object, wherein iterating execution of said first step and said second step comprises iterating execution at successive instants in time to obtain said estimated values of each variable at said successive instants, wherein said third step comprises identifying, based on said mobile objects presented before said magnetometers, a supplementary equation, wherein said supplementary equation defines a relationship of equality between a first variable and a term, wherein said first variable is from said first system of equations, wherein said term is selected from the group consisting of a predefined relationship between one or more other variables from said first system of equations and a constant numerical value, wherein said fourth step comprises replacing, in said first system of equations, said first variable with said term, thereby obtaining a second system of equations, wherein, said second system of equations possesses a first number of variables for which values need to be estimated, wherein said first system of equations possesses a second number of variables for which variables need to be estimated, wherein said first number is less than said second number, and wherein said fifth step comprises replacing said first system of equations with said second system of equations and repeating said first and second steps.

\* \* \* \* \*